United States Patent
Benner

[19]

[11] Patent Number: 6,062,664
[45] Date of Patent: May 16, 2000

[54] FRAME FOR A SWITCHGEAR CABINET

[75] Inventor: Rolf Benner, Herborn, Germany

[73] Assignee: Rittal-Werk Rudolf Loh GmbH & Co., KG, Herborn, Germany

[21] Appl. No.: 08/836,631

[22] PCT Filed: Nov. 2, 1995

[86] PCT No.: PCT/EP95/04288

§ 371 Date: May 2, 1997

§ 102(e) Date: May 2, 1997

[87] PCT Pub. No.: WO96/14730

PCT Pub. Date: May 17, 1996

[30]  Foreign Application Priority Data

Nov. 5, 1994  [DE]  Germany ............................. 44 39 614

[51] Int. Cl.[7] .................................................. A47B 47/00
[52] U.S. Cl. ...................... 312/265.1; 403/231; 403/169; 312/140
[58] Field of Search ................................. 312/140, 257.1, 312/265.1, 265.4; 403/231, 273, 251, 169, 217

[56]  References Cited

U.S. PATENT DOCUMENTS

| | | | |
|---|---|---|---|
| 3,645,569 | 2/1972 | Reilly | 403/217 X |
| 4,632,473 | 12/1986 | Smith | 403/231 X |
| 4,678,359 | 7/1987 | Keen | 312/140 X |
| 4,691,970 | 9/1987 | Neri | 312/140 X |
| 4,768,845 | 9/1988 | Yeh | 312/263 X |
| 5,470,139 | 11/1995 | Hsiao | 312/140 |

*Primary Examiner*—Peter M. Cuomo
*Assistant Examiner*—Stephen Vu
*Attorney, Agent, or Firm*—Jansson, Shupe, Bridge & Munger, Ltd.

[57]  ABSTRACT

A rack for a switch cabinet includes rack members and corner members with connecting projections thereon insertable into connecting receptacles on the rack members. Each rack member, symmetrical about a diagonal plane therealong, is in the form of multiply-curved, open hollow profile sections which form a pair of the connecting receptacles to receive the connecting projections extending from the corner member.

19 Claims, 1 Drawing Sheet

FRAME FOR A SWITCHGEAR CABINET

FIELD OF THE INVENTION

The invention relates to switchgear cabinets and, more particularly, to frames for switchgear cabinet. Still more particularly, the invention relates to switchgear cabinets made up of frame members and corner joints, the corner joints being introduced with plug-in rods into sockets and being connected to the frame members.

BACKGROUND AND OBJECTS OF THE INVENTION

In known frames, hollow sections are frequently used as frame members which form closed sockets for the plug-in rods of the corner joints. Thus the cross-section of the sockets and of the plug-in rods can be square, rectangular or triangular. However, the closed hollow sections are expensive to produce.

Frames are also known which are made up of open frame members. However, in this case the corner joints of the frame require specially-designed connector parts, a plurality of special parts being usually necessary in order to connect the three frame members abutting in the region of the corner. The advantage of the simpler manufacture of the frame members is achieved at the expense of the increased outlay on parts and assembly for building the frame.

The object of the invention is to provide a frame of the type already mentioned, in which corner joints with sockets are also used with frame members designed as hollow sections, and thus the outlay on parts and assembly can be kept low.

SUMMARY OF THE INVENTION

This object is achieved according to the invention in that the inventive structure has a number of particular characteristics: The frame members (sometimes referred to herein as "rack members") are designed as open hollow sections that are bent several times, are symmetrical about a diagonal plane extending therealong, and are open in the area of their inner sides. The frame members, continuing from two portions forming two outer sides (or "outer profile sides") which are perpendicular to one another, are bent inwards several times to form sockets (or "connecting receptacles") for the plug-in rods (or "connecting projections") of a corner joint (or "corner member"). Each socket, thus formed by the bent rack members, contacts the inserted plug-in rod at least at two points distributed over at least 180° (preferably more than 180°) around the cross-section of the plug-in rod.

Each open hollow rack member is provided, for example, by bending to form two sockets into which two plug-in rods of the corner joint may be inserted. The hollow rack member structure is symmetrical about a diagonal plane, and can be used as a frame member at any position of the frame. The only essential point is that the bent-over sockets form at least three contact points for the plug-in rods, which extend over more than 180° of the periphery of the plug-in rods. This ensures that the plug-in rod is held laterally immovably in the socket.

In accordance with one embodiment of this invention, the plug-in rods are round in cross-section, the sockets are formed from three rack-member portions bent inwards at right angles which continue into an inwardly-bent end portion, the rack-member portions which are parallel to one another of the sockets are adapted to the diameter of the round plug-in rods, and each inwardly-bend end portion forms a further contact point for a plug-in rods, then corner members (or "joint members") with plug-in rods which are cut to length from commercially-available bar material may be used. Such plug-in rods are introduced into connecting receptacles in the corner members and secured therein.

If the design is such that the plug-in rods have a square cross-section, and such that the sockets include four rack-member portions inwardly bent at right angles, with the end portion not closing into contact with other portions of the rack member, then the same advantages can be achieved.

An opportunity of attachment over the entire length of the frame members is provided in that the inner portions (or "inner sides") of the sockets, each of which extends in a plane parallel to that of one of the outer profile sides (which are perpendicular to one another) are provided with rows of attachment apertures.

In some embodiments, the outer profile sides are formed to include inwardly-extending rack-member portions, which extend inwardly into the region of the sockets. Such inwardly-extending portions form outward seal-receiving spaces and form a part of the socket. This configuration allows seal members to be attached to the frame member without impairing the formation of the sockets.

According to one embodiment, plug-in rods may be secured in rack-member sockets by a snug press fit (or "friction fit"). This engagement can be further improved by also screwing the plug-in rods to the frame (or "rack") members. Bores in the frame members are usable for this purpose.

THE DRAWING

The invention will be explained in more detail with reference to an embodiment given by way of example and shown in exploded view in the drawing.

DETAILED DESCRIPTION OF PREFERRED EMBODIMENTS

Figure 1:
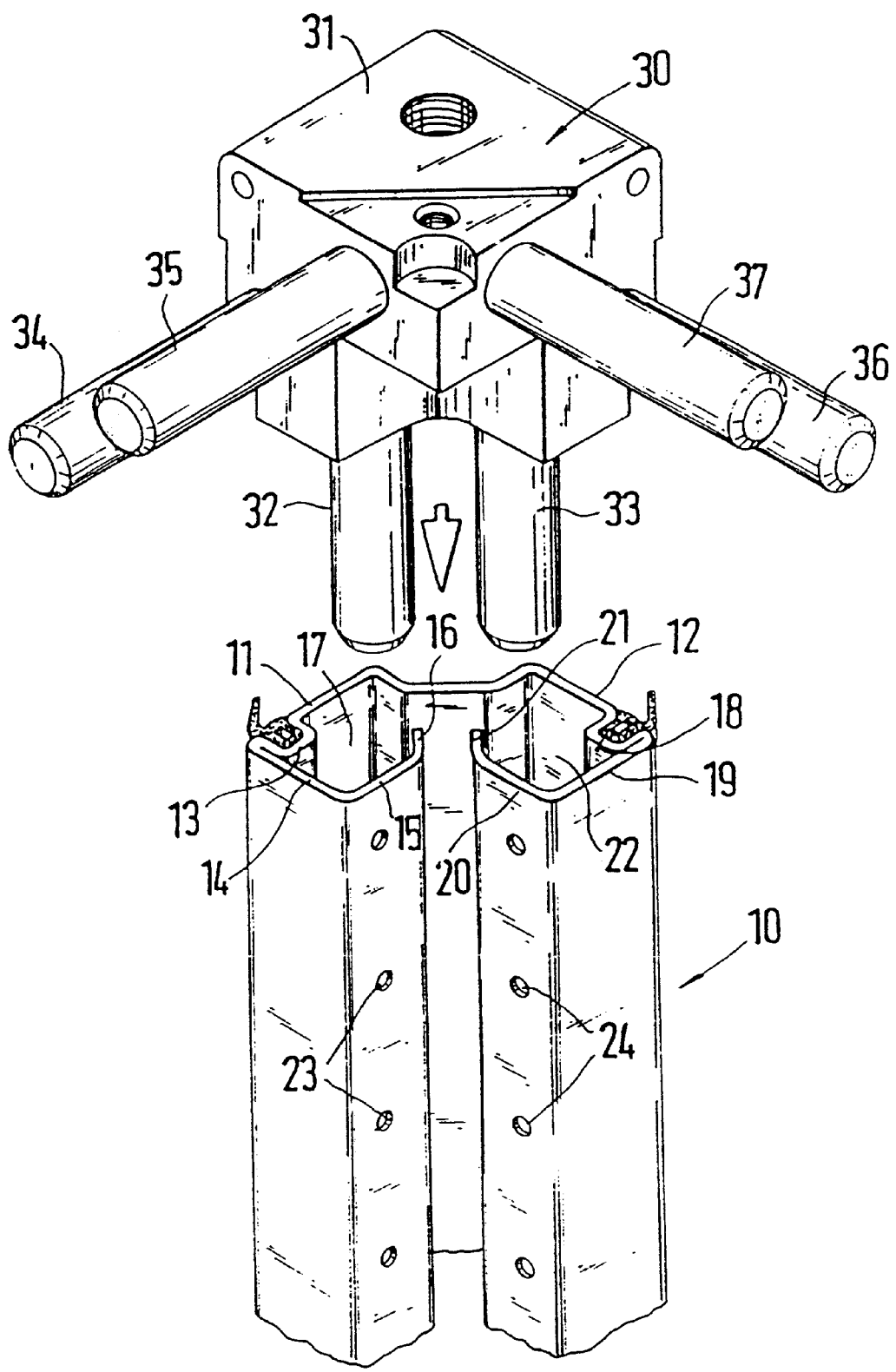

As the drawing shows, only one connection is shown between a corner joint 30 and a frame member 10. After provision of the rows of bores 23 and 24 in a sheet metal strip of appropriate width, frame member 10 is produced, for example, by bending.

Section sides 11 and 12 form the outer sides of the frame member 10, which stand perpendicular to one another. The outer edge is beveled and section sides 11 and 12 are bent inwardly in order to form receiving grooves for seal members. Portions 13 and 18 of these receiving grooves form portions of sockets 17 and 22. Sockets 17 and 22 are completed by respective inwardly bent portions 14, 15 and 16 or 19, 20 and 21.

The spacing between portions 13 and 15 or 18 and 20 is adapted to the diameter of round plug-in rods 32–37 at base portion 31 of corner joint 30. End portions 16 and 21 are bent inwards so far that they form a further, fourth contact point for round plug-in rods 32–37. Therefore, each of the two plug-in rods 32 and 33 abuts on all four portions 13–16 or 18–21 of the sockets 17 or 22. These four contact points are distributed over more than 180° of the periphery of plug-in rods 32 or 33, so that they are positively secured laterally.

If end portions 16 and 21 are bent in at right angles, then square or rectangular plug-in rods can be secured in the sockets.

Portions 15 and 20 of sockets 17 and 22, respectively, which extend parallel to section sides 11 and 12, are provided with rows of bores 23 and 24 in order to provide opportunities of attachment over the entire length of frame member 10.

Frame member 10 is open in the region of the inner side and designed to be symmetrical about a diagonal plane extending therealong and of the same shape therealong so that any portion of the frame member can be used. In this respect, only the alignment of section sides 11 and 12 need be considered.

Corner joint 30 has a base portion 31, which carries on its sides pairs of plug-in rods—32–33, 34–35 and 36–37, respectively—in order to connect together the three frame members 10 perpendicularly abutting one another in the corner areas of a frame. The arrangement of plug-in rods 32–37 is like this so that connection of frame member 10 is only possible in the correct alignment with section sides 11 and 12 facing outwardly. The pairs of plug-in rods are separated by a spacing adapted to the spacing between sockets 17 and 22 in frame member 10.

The cross-section of the plug-in rods can be varied as long as care is taken such that the bent-over portions of the frame member form sockets which have at least three contact points for the plug-in rod, and which are distributed over the periphery of the socket by over more than 180°.

Plug-in rods 32–37 can be cut to length also from commercially-available bar members and may be inserted in receiving means in base portion 31 of the corner joint. Thus the length of plug-in rods 32–37 can be varied and adapted to the desired torsion-resisting rigidity of the frame.

While the principles of this invention have been described in connection with specific embodiments, it should be understood clearly that these descriptions are made only by way of example and are not intended to limit the scope of the invention.

I claim:

1. A rack for a switch cabinet comprising rack members defining a pair of connecting receptacles and corner members having connecting projections, each of the projections is inserted into a respective one of the connecting receptacles on the rack member, the improvement wherein:

each rack member is formed of a single sheet having plural bends to provide first and second spaced-apart open hollow profile sections, said rack member being symmetrical about a diagonal plane between the sections and having two outer profile sides perpendicular to each other;

each of the profile sections forms a connecting receptacle defined by a respective one of the outer profile sides and by a plurality of the portions bent inwardly toward said respective one of the outer profile sides and defining a slot therebetween extending parallel to the connecting receptacles;

each of the receptacles receives a respective one of the connecting projections;

each of the connecting projections is cylindrical; and each of the connecting receptacles abuts the connecting projection received therein along at least at three lines of contact circumferentially spaced by at least 180° around the respective connecting projection.

2. The switch-cabinet rack of claim 1 wherein each of the connecting projections is held in its respective connecting receptacle by friction press fit.

3. The switch-cabinet rack of claim 2 wherein the connecting projections are screwed to the rack member.

4. The switch-cabinet rack of claim 1 wherein each of the outer profile sides includes a seal-receiving groove extending therealong.

5. The switch-cabinet rack of claim 4 wherein each of the connecting projections is held in its respective connecting receptacle by friction press fit.

6. The switch-cabinet rack of claim 5 wherein the connecting projections are screwed to the rack member.

7. The switch-cabinet rack of claim 1 wherein:

each of the connecting receptacles having one of its inwardly bent portions with a row of attachment apertures therealong; and the inwardly bent portions having the respective rows of attachment apertures therealong are perpendicular to one another.

8. The switch-cabinet rack of claim 1 wherein:

each of the connecting receptacles, having a plurality of portions in succession, said portions bent inwardly at substantially right angles;

such that said plurality of portions terminate in an inwardly-bent end portion.

9. The switch-cabinet rack of claim 8 wherein the connecting projections are held in their respective connecting receptacles by friction press fit.

10. The switch-cabinet rack of claim 9 wherein the connecting projections are screwed to the rack member.

11. The switch-cabinet rack of claim 8 wherein each of the outer profile sides has a seal-receiving groove extending therealong.

12. The switch-cabinet rack of claim 11 wherein the connecting projections are held in their respective connecting receptacles by friction press fit.

13. The switch-cabinet rack of claim 12 wherein the connecting projections are screwed to the rack member.

14. The switch-cabinet rack of claim 1 wherein:

each of the connecting receptacles having one of its inwardly bent portions with a row of attachment apertures therealong; and the inwardly bent portions having the respective rows of attachment apertures therealong are perpendicular to one another.

15. The switch-cabinet rack of claim 1 wherein:

each of the plurality of portions bent inwardly includes a terminal end portion having an edge which is free of contact with any other portion of the rack member.

16. The switch-cabinet rack of claim 1 wherein the connecting projections are free of slots.

17. A rack for a switch cabinet comprising rack members defining a pair of connecting receptacles and corner members having connecting projections, each of the projections inserted into a respective one of the connecting receptacles on the rack member, the improvement wherein:

each rack member is formed of a single sheet having plural bends to provide first and second connecting receptacles, said rack member having two outer profile sides perpendicular to each other;

each of the connecting receptacles is formed of four inwardly bent rack-member portions including rack-member portions inwardly bent at right angles, the four rack-member portions terminating in an edge which is free of contact with any other portion of the rack member;

a slot is defined along each edge and extends parallel to the connecting receptacles;

each of the receptacles receives a respective one of the connecting projections; and each of the connecting projections has a rectangular cross-section.

18. The switch cabinet rack of claim 17 wherein each of the connecting projections is held in its respective connecting receptacle by friction press fit.

19. The switch cabinet rack of claim 18 wherein each of the connecting projections is screwed to its respective rack member.

* * * * *